United States Patent
Wang et al.

(10) Patent No.: US 11,009,405 B1
(45) Date of Patent: May 18, 2021

(54) SYSTEM FOR EARLY WARNING AND POSITIONING OF OVERHEATING INSIDE LITHIUM ION BATTERY PACK AND METHOD FOR USING THE SAME

(71) Applicant: NANJING TECH UNIVERSITY, Nanjing (CN)

(72) Inventors: Zhirong Wang, Nanjing (CN); Jinlong Bai, Nanjing (CN); Yin Liang, Nanjing (CN)

( * ) Notice: Subject to any disclaimer, the term of this patent is extended or adjusted under 35 U.S.C. 154(b) by 0 days.

(21) Appl. No.: 16/914,505

(22) Filed: Jun. 29, 2020

(30) Foreign Application Priority Data

Dec. 26, 2019 (CN) .......................... 201911362171.8

(51) Int. Cl.

| | | |
|---|---|---|
| G01K 11/06 | (2006.01) |
| G01R 31/396 | (2019.01) |
| G01R 31/371 | (2019.01) |
| G01R 31/52 | (2020.01) |
| G08B 7/06 | (2006.01) |
| H02H 9/02 | (2006.01) |
| G08B 25/06 | (2006.01) |
| H04B 3/54 | (2006.01) |
| G01K 3/00 | (2006.01) |
| G08B 21/18 | (2006.01) |

(52) U.S. Cl.
CPC .............. *G01K 11/06* (2013.01); *G01K 3/005* (2013.01); *G01R 31/371* (2019.01); *G01R 31/396* (2019.01); *G01R 31/52* (2020.01); *G08B 7/06* (2013.01); *G08B 21/182* (2013.01); *H02H 9/02* (2013.01)

(58) Field of Classification Search
CPC ....................................................... G01K 11/06
See application file for complete search history.

(56) References Cited

U.S. PATENT DOCUMENTS

| | | | | |
|---|---|---|---|---|
| 5,808,296 A | * | 9/1998 | McMonagle | H03F 3/45475 250/221 |
| 2010/0206280 A1 | * | 8/2010 | Nomura | F02D 41/2435 123/672 |
| 2013/0043829 A1 | * | 2/2013 | Gurlahosur | H02M 1/08 320/107 |
| 2020/0350770 A1 | * | 11/2020 | Dan | H01M 10/486 |
| 2021/0028633 A1 | * | 1/2021 | Kanou | H02J 7/0036 |

FOREIGN PATENT DOCUMENTS

CN 201911362171.8 3/2020

* cited by examiner

*Primary Examiner* — Joseph H Feild
*Assistant Examiner* — Pameshanand Mahase

(57) ABSTRACT

A system and method for early-warning and positioning of overheating in a lithium ion battery pack is disclosed, especially for a single battery in the lithium ion battery pack during use. The system Includes a sensor unit, a controller unit, an alarm unit and an auxiliary unit; the sensor unit includes a special flexible thin film sensor; the controller unit includes a single chip microprocessor, an alarm controller, a computer and a display, the single chip microprocessor and the alarm controller being connected to the computer, the computer being connected to the display; the alarm unit includes a LED alarm light and a buzzer; the single chip microprocessor of the controller unit is connected to the flexible film sensor; the auxiliary unit includes a power supply and a constant value resistor; the power supply provides power separately to the controller unit and the alarm unit, and the constant value resistor is directly connected to the power supply.

7 Claims, 5 Drawing Sheets

DRAWINGS

SYSTEM FOR EARLY WARNING AND POSITIONING OF OVERHEATING INSIDE LITHIUM ION BATTERY PACK AND METHOD FOR USING THE SAME

CROSS REFERENCE TO RELATED APPLICATION

This application claims the priority benefit of Chinese Patent Application No. CN201911362171.8, filed on Dec. 26, 2019, entitled "System for Early Warning and Positioning of Overheating inside Lithium Ion Battery Pack and Method for Using the Same"; the content of which is hereby incorporated by reference in its entirety.

TECHNICAL FIELD

The invention relates to a system and method for early warning and positioning of overheating in a lithium ion battery pack, in particular, to a system and method for early warning and positioning of overheating of a single battery cell in the lithium ion battery pack during use.

BACKGROUND

With the emphasis on environmental protection, new energy source has gained popularity and usage. Lithium ion batteries are widely used in various devices due to their high energy density, light weight, high cycle number, and stable charge and discharge voltage. In the field of new energy vehicles, almost all new energy vehicles currently use lithium ion batteries as power sources.

Due to its inherent properties, lithium ion batteries are prone to heat accumulation during charge and discharge and during use. Thermal runaway may occur under unsatisfactory external heat dissipation conditions. Defects may also be introduced into the lithium ion batteries during production process. These defects can cause a decrease of thermal stability of the battery, accelerates local chemical reactions inside the battery, causing the battery to overheat, which in turn leads to thermal runaway, in severe cases explosion of battery pack of electric vehicles. With the increased adoption of electric vehicles, the number of electric vehicles is increasing, and are more and more accidents such as spontaneous combustion and explosion have occurred. Some of these accidents are caused by external impacts on the battery pack, but most accidents occurred without prior indication, and pose a serious threat to life and property. When it comes to the thermal runaway accident of a lithium ion battery pack, the initial trigger is the high temperature and thermal runaway in a single cell. The heat generated by the thermal runaway of the single cell in turn heats up other surrounding batteries, and the surrounding batteries reach their thermal runaway subsequently. Thus, there is a domino effect in the thermal runaway of the lithium ion battery pack, which means that the thermal runaway of a single battery cell often quickly spreads to the entire battery pack. Nowadays, lithium ion battery packs of electric vehicles generally adopt a sealed design. In order to ensure energy density, the batteries in the battery pack are densely packed. Once a battery is overheated, heat is easily propagated to the surrounding batteries, resulting in the battery thermal runaway in the battery pack.

At present, once a thermal runaway in a single cell appears in a lithium ion battery pack, it is very difficult to cool down and extinguish the ensuing fire, because the lithium ion battery pack is very compact, the number of single cells is large, and the spread of thermal runaway rapid. It is difficult to monitor temperature and locate overheated battery cell. It should be pointed out that it is more difficult to cool and extinguish a single thermal runaway battery cell, because the thermal runaway of the battery cell is a result of acceleration of the internal reaction of the battery leading to the acceleration of the violent exothermic side reaction. This reaction does not require external oxygen, and the reaction is very violent, once the thermal runaway occurs, it is very difficult to stop. In addition, the interval between the start of temperature rising abnormally to the appearance of thermal runaway is short for Lithium ion batteries; therefore, it is necessary to quickly locate the overheated battery cell after the temperature of the lithium ion battery exceeds the normal operating temperature, to facilitate the implementation of subsequent protective measures. Therefore, it is necessary to monitor the lithium ion battery during its working process and issue early warning signals when it is overheated, in order to avoid thermal runaway of the lithium ion battery. For lithium ion batteries, the surface temperature during normal operation does not exceed 60° C., and the surface temperature at the beginning of lithium ion battery thermal runaway is about 110° C. to 130° C. Therefore, for the detection of overheating of lithium ion batteries, the range between these two temperatures is the detection range, and it is necessary to issue an overheat warning when the battery surface temperature is between these two temperatures.

The existing sensors used in the overheat detection of lithium ion battery packs are thermocouples, thermistors or infrared temperature sensors. The principle of thermocouple temperature measurement is that the thermocouple is composed of two different metal wires (metal A and metal B) connected at one end. When one end of the thermocouple is heated, there is an electric potential differential in the thermocouple circuit. The measured potential differential can be used to calculate the temperature. The working principle of the thermistor is that the resistance of the sensor material changes with temperature, and the temperature is calculated by measuring the resistance value of the sensor. For example, the Chinese invention patent CN107702801A discloses a "lithium ion battery thermal runaway early warning device" that detects the temperature in the battery pack through an infrared temperature sensor installed inside the battery pack. This methods of measuring the temperature of the battery pack through infrared temperature sensors, thermistors, thermocouples and other sensors have certain shortcomings. Since both the thermocouple and thermistor can only measure the point temperature, a lag in the temperature measurement is introduced by the thermocouple or thermistor at a distance farther away from the temperature measurement point. Because the lithium ion battery pack has a short interval from the start of an abnormal temperature rise to a thermal runaway, this lag will cause the accident to not be detected timely. The lithium ion battery pack has a compact design and no free space. The infrared temperature sensor cannot detect multiple lithium ion batteries, and the working principle of the infrared temperature sensor determines that it must maintain a certain distance from the battery, and there must be no obstruction within this distance, which means a large amount of free space needs to be reserved for the infrared temperature sensor to function in battery packs, resulting in increased volume and reduced energy density of the lithium ion battery pack. As a result, the infrared temperature sensor is not suitable for temperature detection in the lithium ion battery pack.

In addition, because the shape of the finished thermocouple or thermistor on the market is fixed and non-transformable, the infrared temperature sensor cannot cover all the battery cells, and the fit with the battery is not high, and the measured temperature does not reflect the true battery surface temperature. In addition, the installation of thermistors, thermocouples, and infrared temperature sensors inevitably occupies the internal space of the battery pack and affects the internal structure of the battery pack, the number of installations is therefore limited, and the positioning of the overheated lithium ion battery cell cannot be achieved.

The thin-film sensor is a flexible sensor. Its shape can be designed according to the usage scenario. It has a small size, light weight, small thickness, and is soft. It can be closely attached to the surface of the object to be detected. The thin-film sensor has a simple detection mechanism. The energy requirement is extremely low, and most thin-film sensors can work without power supply, and the thin-film sensors are very durable and can withstand bending and vibration for a long time. Therefore, a flexible thin-film sensor can be placed as close as possible to the surface of a battery cell without affecting the internal structure of the battery pack. However, the internal structures of thin-film sensors dedicated to temperature detection are complicated, and their production difficult and costly. In a lithium battery-powered car, there are 6000 to 8000 type-18650 or type-21700 cells in the battery pack, and it is impossible to installs sensors in one to one correspondence to battery cell. For the platinum resistance thin film temperature sensor, the structure and detection principle are relatively simple; however, the production is difficult, the cost is high, and it is not suitable for the detection and positioning of overheated lithium ion batteries in lithium ion battery packs. At present, the platinum resistance thin film temperature sensor cannot be adapted to be distributed among the measuring point array on the same sensor, and one battery must correspond to one sensor, which leads to a huge number of necessary terminals. Therefore, the traditional thin film temperature sensor is inadequate for overheat detection and positioning of lithium ion battery cells in the lithium ion battery pack.

SUMMARY

A system and method for early warning and positioning of overheated battery cells in a lithium ion battery pack is provided, in view of the above deficiencies, and use the flexible thin film sensor to perform overheat detection, early warning and positioning in single cells in a lithium ion battery pack are described, so that when the temperature of a single battery cell is higher above a set temperature, the event can be processed in time to prevent the development of thermal runaway accidents. The disclosure makes up for the shortcomings of the current lack of detection and positioning technology for overheated battery cells in lithium ion battery packs.

The followings further describe the technical solutions in the current invention.

A system for early-warning and positioning of interior overheating in a lithium ion battery pack, including a sensor unit, a controller unit, an alarm unit, and an auxiliary unit. The sensor unit adopts a flexible thin film sensor and is a novel sensor specifically for temperature monitoring and based on flexible thin film sensor. The controller unit includes a single chip microprocessor, an alarm controller, a computer and a display; wherein the single chip microprocessor and the alarm controller are connected to the computer, and the computer is connected to the display, and the single chip microprocessor is connected to the flexible thin film sensor. The alarm unit includes a LED alarm light and a buzzer. The auxiliary unit includes a power supply and a constant value resistor, wherein the power supply provides power separately to the controller unit and the alarm unit, and wherein the constant value resistor is directly connected to the power supply and configured to prevent the power supply from being damaged by short-circuit.

In one embodiment, the single chip microprocessor is a STM32 series single chip microprocessor. The signals detected by the flexible thin film sensor used in the present invention belong to simple switch on and off signals, the number of signals is small, the discrimination is easy, and the performance requirements of the single chip microprocessor are not high, an expansion 10 port is used for the connection between the single chip microprocessor and the flexible thin film sensor.

The structure of the flexible thin film sensor, from top to bottom, include an upper substrate layer, an upper layer metal sheet, an intermediate layer, a lower layer metal sheet, and a lower substrate layer; wherein the layers are pressed into the flexible thin film sensor; wherein the lower layer metal sheet and the upper layer metal sheet are respectively connected to a positive and a negative electrode via wires, and configured to test whether the two metal sheets are short-circuited.

Preferably, the upper substrate and the lower substrate comprises polyimide film, the upper surface of the upper substrate and/or the lower surface of the lower substrate comprises an adhesive layer configured to tightly bind to the battery cell to enhance thermal conductivity.

Preferably, the upper layer metal sheet and the lower layer metal sheet comprise metal foil, referred as upper layer metal foil and lower layer metal foil. An upper layer metal foil is placed inside a that is, the upper metal foil and the lower metal foil are formed. An upper metal foil is placed inside a flexible thin film sensor corresponding to a battery cell, for each battery cells of the battery pack. Positioning of local overheating spot is achieved by measuring short-circuit event between upper layer metal foil and lower layer metal foil.

In some embodiments, non-metal material with good electric and thermal conductivity, such as graphene, can be used to replace the metal foil.

The wires comprise flexible printed circuit or metal wires, adjusted according to processing difficulty and cost, and configured to be sufficiently small and pliable to make connection without affecting the battery layout.

In some embodiments, the intermediate layer comprises thin films made of plastics with different melting points. Different melting points are achieved by varying the material and thickness of the plastic films, A variety of plastic films melted at a variety of temperatures respectively are used according to the need to detect overheating at a variety of temperatures. In one embodiment, for the detection of the start of overheating of a battery cell, a plastic film with a melting temperature of about 70° C. is used; in another embodiment, for detection of thermal runaway of a battery cell, a plastic film with a melting point of about 120° C. is selected; In still another embodiment, for monitoring temperatures between the start of overheating and the thermal runaway, plastic films with melting temperatures between 70 and 120° C. are used.

When the use of the flexible thin film sensor, when a lithium ion battery cell is overheated, a portion of the intermediate layer of the flexible thin film in contact with the battery melts, causing a pair of upper layer metal sheet and lower layer metal sheet corresponding to the short-circuit location to come into contact and become short-circuited. Thus, battery overheating is determined based on a presence of short-circuit within the flexible thin film sensor, which in turn is an indicator of overheating in the battery. Positioning of the overheated battery cell is achieved by specifically distinguishing the pair of short-circuited upper metal sheet and lower metal sheet. A plurality of flexible thin film sensors can be deployed according to needs. When the number of battery cells in the battery pack are large, a single flexible thin film sensor has to have a very large size to cover them; therefor, multiple smaller flexible thin-film sensors can be used instead.

The single chip microprocessor is connected to the flexible thin film sensor, the single chip microprocessor determines the address of the pair of upper layer metal sheet and lower layer metal sheet corresponding to the short-circuit location, and sending the address to the computer; meanwhile, the single chip microprocessor sends an alarm signal to the alarm controller. The alarm controller prompts the LED alarm lamp to flash and the buzzer to sound an alarm sound, according to the alarm signal; upon receiving the address of the short-circuited pair of upper layer metal sheet and lower metal sheet, the computer determines the position of the lithium ion battery cell and shows the positional information on the display.

Mechanisms:

When the device of the present invention is in use, the flexible thin film sensor closely adheres to the surface of the lithium ion battery to be tested. Because the flexible thin-film sensor in close contact with the battery cell is provided with the upper layer metal sheet and the lower layer metal sheet that have a good thermal conductivity, the temperature distribution in the flexible thin film sensor is the same as the temperature distribution of the tested lithium ion battery. When the temperature of a lithium ion battery cell under test exceeds the melting point or melting temperature of the plastic film of the intermediate layer, a portion of the intermediate layer melts away, so that corresponding upper layer metal sheet and lower layer metal sheet come directly into contact, resulting in a short-circuit. Overheating of the battery cell is determined by determining the connectivity of the upper layer metal sheet and the lower metal sheet.

When the temperature of a single battery cell in the tested lithium ion battery pack exceeds the pre-set melting temperature of the intermediate layer of the flexible film sensor in contact, a pair of upper layer metal sheet and lower layer metal sheet in the corresponding area of the flexible film sensor becomes electrically connected, and the single chip microprocessor detects a short-circuit signal and sends an alarm signal to the alarm controller. The alarm controller activates the alarm unit. The alarm unit flashes LED alarm light and activates the buzzer to send out an alarm signal. The single chip microprocessor also determines the address of the short-circuited pieces of metal foil of the metal sheets, and transmits the address information to the computer. The computer calculates the position of the overheated battery cell by comparing the address information with stored battery pack data, and display the position of the overheated battery cell on the display.

Compared with prior art, the device of the present invention has a reasonable structure and is easy to use. The short-circuit signal detection is very reliable because the flexible thin-film sensor is in close contact with the lithium ion battery under test. The overheat information can be converted into an electrical signal in real time to achieve real-time detection of battery overheating, effectively improves the timeliness of overheating detection. The flexible thin-film sensor has a small thickness and a shape that can be designed according to the arrangement of the battery cells in the lithium ion battery pack being tested, and is pliable and can be wound, effectively overcoming shortcomings of traditional temperature sensors, including low coverage rate, difficult layout design, and invasion of the internal space of the battery pack. As a result, the device of the present invention makes the overheat detection of the lithium ion battery under test more accurate and reliable.

Other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

BRIEF DESCRIPTION OF THE DRAWINGS

The invention may best be understood by referring to the following description and accompanying drawings that are used to illustrate embodiments of the invention. The invention is illustrated by ways of example in the embodiments and it not limited in the figures of the accompanying drawings, in which like references indicates similar elements.

ANNOTATION FOR THE FIGURES

1. Flexible thin film sensor; 2. LED alarm light; 3. Alarm controller; 4. Buzzer; 5. Constant value resister; 6. Power supply; 7. Single chip microprocessor; 8, Computer; 9, Display; 10. Upper layer metal sheet; 11. Wires; 12. Upper substrate layer; 13. connection terminal; 14. intermediate layer; 15. lower layer metal sheet; 16. lower substrate layer; 17. lithium ion battery under test.

DETAILED DESCRIPTION OF THE PREFERRED EMBODIMENTS

It is apparent that the described embodiments are a part, rather than the entire embodiments of the invention. All other embodiments obtained by those of ordinary skill in the art based on the embodiments of the present invention without creative efforts are within the scope of the present invention.

Figure 1:
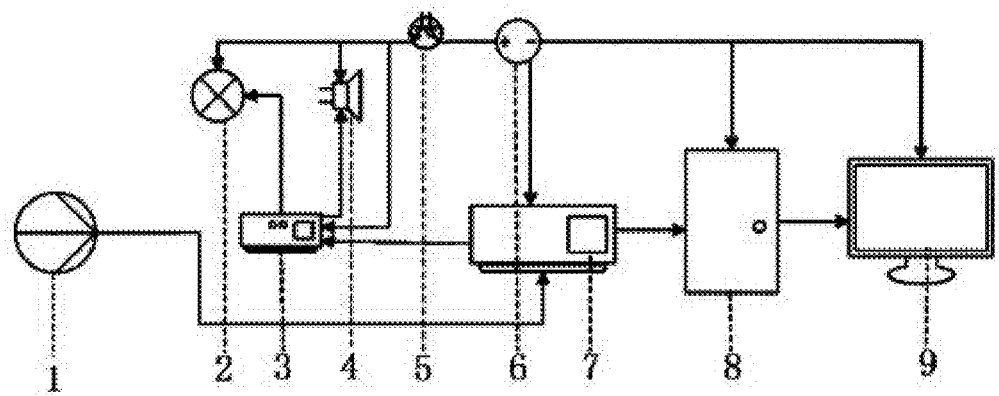
FIG. 1 is a diagram showing structure of a system for early warning and positioning of overheating inside lithium ion battery pack.
Figure 2:
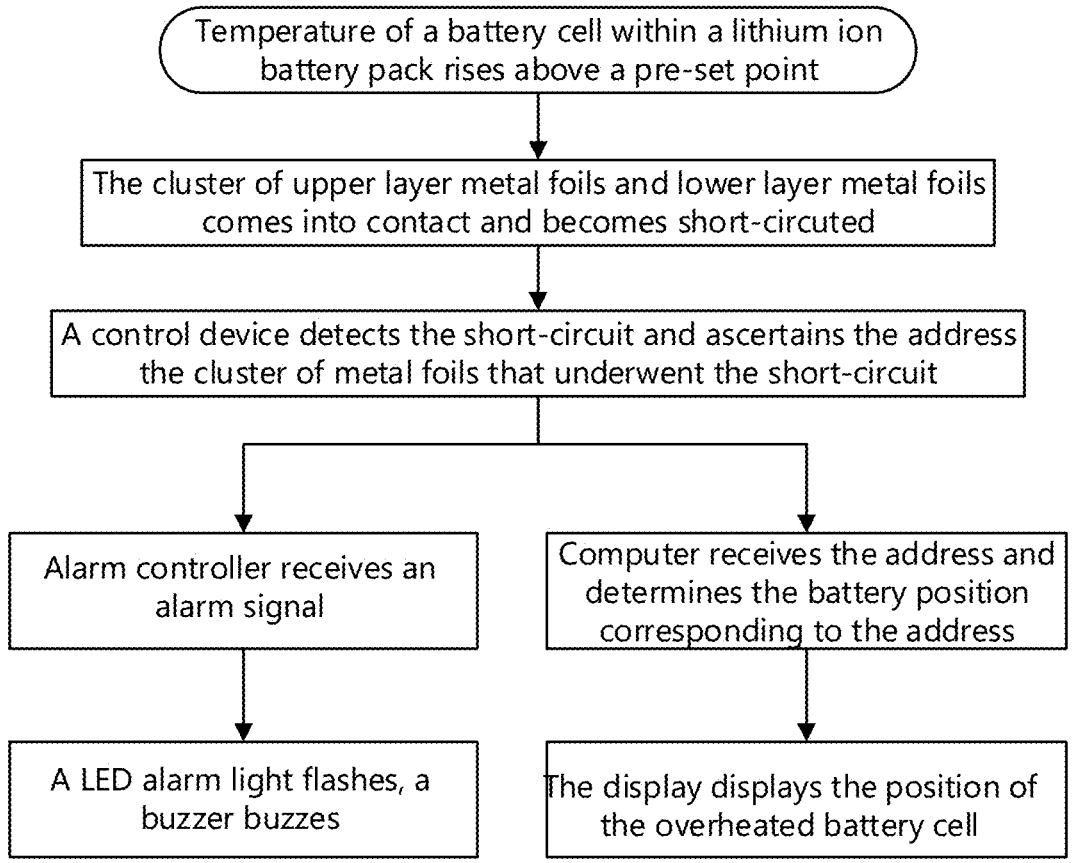
FIG. 2 flow diagram showing a method for early warning and positioning of overheating inside lithium ion battery pack, according to one embodiment.

As shown in FIG. 1 and FIG. 2, a system for early-warning and positioning of interior overheating in a lithium ion battery pack is disclosed in the instant application. The system comprises a sensor unit, a controller unit, an alarm unit, and an auxiliary unit; the sensor unit utilizes a flexible thin film sensor 1; the controller unit comprises a single chip microprocessor 7, an alarm controller 3, a computer 8, and a display 9, wherein the single chip microprocessor 7 and the alarm controller 3 are connected to the computer 8, and the computer 8 is connected to the display 9; and wherein the single chip microprocessor 7 is connected to the flexible thin film sensor 1; the alarm unit comprises a LED alarm light 2 and a buzzer 4; the auxiliary unit comprises a power supply 6 and a constant value resistor 5, wherein the power supply 6 provides power separately to the controller unit and the alarm unit, and wherein single chip microprocessor 7 uses direct current electricity; the constant value resistor 5 is directly connected to the power supply 6 and configured to prevent the power supply from being damaged by short-circuit. The flexible thin film sensor 1 comprises: an upper substrate layer 12, an upper layer metal sheet 10, an intermediate layer 14, a lower layer metal sheet 15, and a lower substrate layer 16; wherein the layers are pressed into the flexible thin film sensor; wherein the upper layer metal sheet 10 and the lower layer metal sheet 15 are respectively connected to a positive and a negative electrode via wires, and configured to test whether the two metal sheets are short-circuited.

When in use, the flexible thin film sensor 1 closely adheres to the surface of the lithium ion battery under test 17. Due to thermal conduction provided by the upper layer metal sheet 10 and the lower layer metal sheet 15, the temperature distribution in the flexible thin film sensor 1 is the same as the temperature distribution of the lithium ion battery under test 17. When the temperature of some part of the lithium ion battery under test 17 exceeds the melting point of the intermediate layer 14, a portion of the intermediate layer 14 melts away, causing direct contact and short-circuit between the upper layer metal sheet 10 and the lower layer metal sheet 15 at the location corresponding to the overheating location. Overheating of the lithium ion battery under test 17 is determined by determining the connectivity of the upper layer metal sheet 10 and the lower metal sheet 15. The single chip microprocessor 7 detects the short-circuit signal and sends an alarm signal to the alarm controller 3. The alarm controller 3 activates the alarm unit. The alarm unit flashes LED alarm light 2 and activates the buzzer 4 to send out an alarm signal. The single chip microprocessor also determines the address of the short-circuited metal sheets, and transmits the address information to the computer 8. The computer 8 calculates the position of the overheated battery cell by comparing the address information with stored battery pack data, and display the position of the overheated battery cell on the display.

FIG. 2 illustrates the steps used in early warning and positioning. The flexible thin film sensor 1 is closely adhered to each battery cell in the battery pack, to ensure temperature of the sensor is the same as the temperature of the battery cells. When an abnormal temperature elevation occurs in the battery pack, early warning and positioning is achieved by the following steps:

1) when temperature of a lithium ion battery exceeds a set temperature, detecting the melting of a portion of the intermediate layer of the flexible thin film sensor 1 in contact with the lithium ion battery, by detecting a short-circuit of a pair of upper layer metal sheet and lower layer metal sheet corresponding to the short-circuit location, and transmitting a short-circuit signal to the single chip microprocessor 7;

2) upon receiving the short-circuit signal, sending an alarm signal by the single chip microprocessor 7 to the alarm controller 3; the alarm controller 3 prompts the LED alarm light 2 to flash and prompts the buzzer 4 to send out an alarm sound;

3) upon receiving the short-circuit signal, determining, by the single chip microprocessor 7, an address of the pair of upper layer metal sheet and lower layer metal sheet corresponding to the short-circuit location, and sending the address to the computer 8; and 4) upon receiving the address, determining, by the computer 8, the position of the lithium ion battery; and showing the position on the display 9.

Embodiment 1

Figure 3:
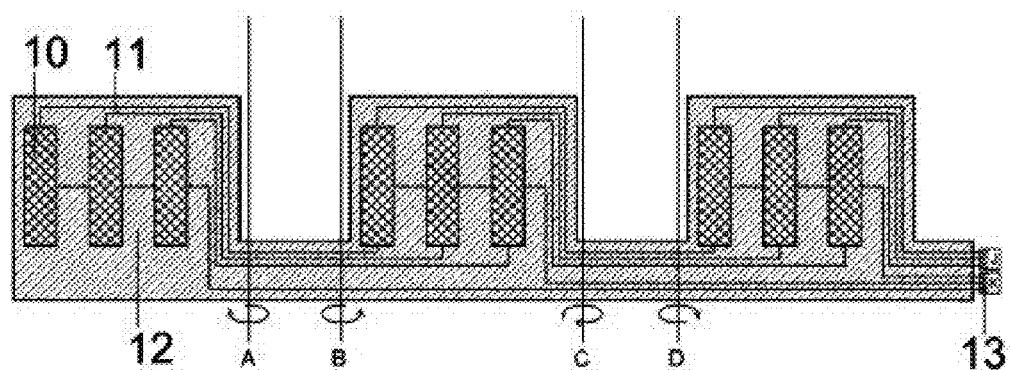
FIG. 3 is an illustration showing, by way of example, the structure of a flexible thin film sensor, according to one embodiment.
Figure 4:
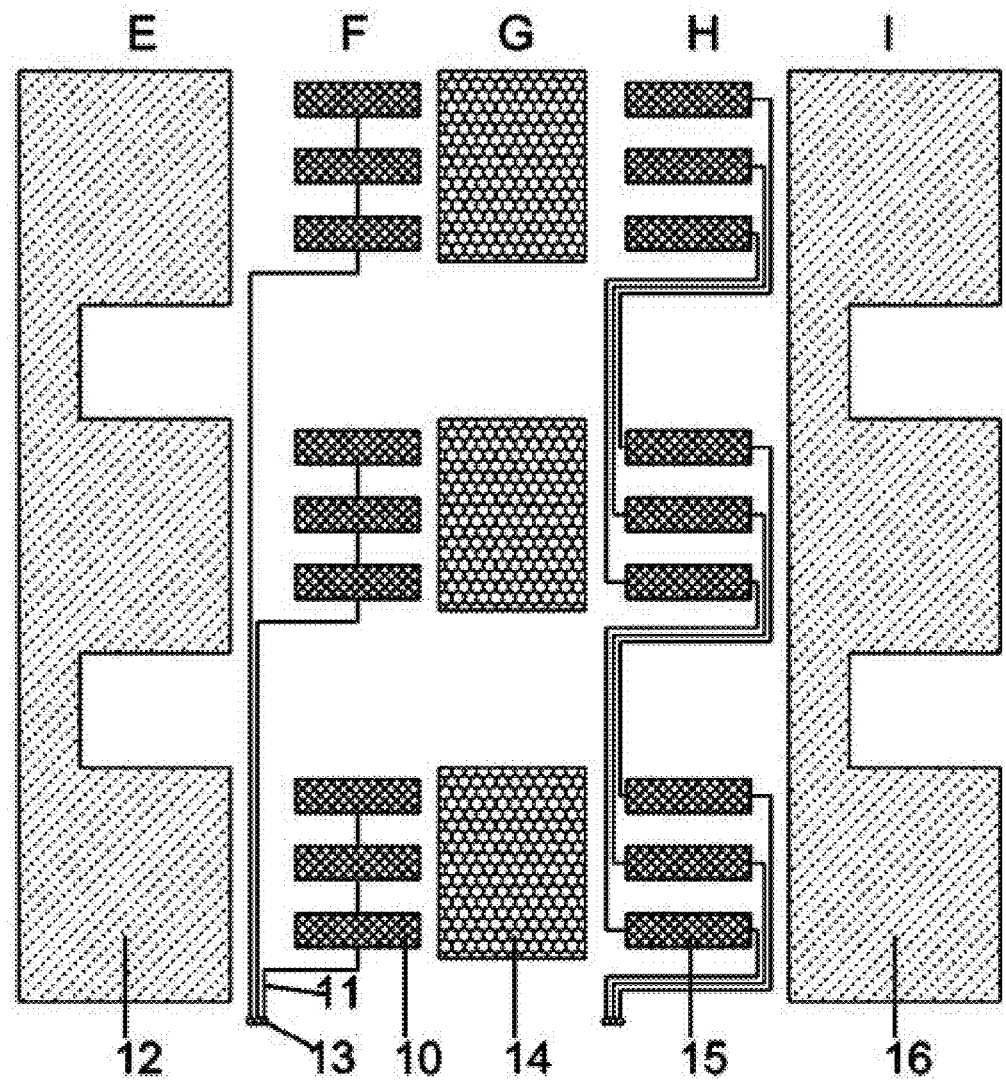
FIG. 4 is an exploded view showing, by way of example, the structure of a flexible thin film sensor, according to one embodiment.

As shown in FIG. 3 and FIG. 4, the upper layer metal sheet 10 and the lower layer metal sheet 15 comprises a plurality of metal foils.

As shown in FIG. 4, the five layers in the flexible thin film sensor 1 are compress into one in the sequence of "E", "F", "G", "H", "I", wherein "E" refers to the upper substrate layer 12, made from polyimide film. The upper substrate layer 12 has an area larger than those of the upper layer metal sheet, the intermediate layer, and the lower layer metal sheet, in order to protect these three layers. "F" consists of the upper layer metal sheet 10 and the wires 11. One end of the wires 11 is connected to the upper layer metal sheet 10 and the other end is connected to the connection terminal 13. "G" layer consists of the intermediate layer 14, the intermediate layer 14 is made from plastic film of various melting points, and insulates the upper layer metal sheet 10 and the lower layer metal sheet 15. When the temperature of the lithium ion battery under test 17 exceeds the melting temperature of the intermediate layer 14, the plastic film in the corresponding position will melt away, causing the upper layer metal sheet 10 and the lower layer metal sheet 15 to come into direct contact and establish electric connection and a short-circuit. "H" refers to the lower layer metal sheet 15, which has similar functions to those of the upper layer metal sheet 10. The wirings of the lower layer metal sheet 15 is separated from the wiring of the upper layer metal sheet 11 to prevent internal short-circuiting. "I" refers to the lower substrate layer 16, which has the same material and shape as the upper substrate layer 12. It is worth noting that the number and arraying of the metal foils can vary according the number of battery cells within the battery pack. In one embodiment, the internal wiring of the upper layer metal sheet 10 are all horizontal or perpendicular, whereas the internal wiring of the lower layer metal sheet 15 are all correspondingly perpendicular or horizontal, to minimize internal short-circuiting. The wirings of the upper layer and the lower layer need to be distinguished, to facilitate searching for address of the connection terminal 13.

The plastic film in the intermediate layer 14 has a fixed melting temperature adjusted to the purpose of measurements. When monitoring a start of battery cell overheating, a PVC plastic film with a melting point of 70° C. can be used. When monitoring battery thermal runaway, a polyethylene plastic film with a melting point of 110° C.-120° C. can be used. When monitoring a state between battery overheating and battery thermal runaway, a plastic film with a melting point of between 70° C. to 120° C. can be used.

The shape of the upper layer metal foils and the lower layer metal foils must be identical and their positions must coincide. The purpose is to ensure that overheating at any location will cause short-circuit of the upper and lower metal foils. The rules for arranging the metal foils can be laid out according to the arrangement of the lithium ion batteries in the lithium ion battery pack, and the design principle is that each lithium ion battery is in contact with the flexible thin film sensor 1, and each contact region has metal foils as temperature sensing area.

Embodiment 2

As shown in FIG. 4, the connection of the metal foils in the flexible thin film sensor 1 is achieved by using metal wires or flexible printed circuits. In one embodiment, in order to minimize the numbers of the connection terminals 13 and facilitate the connection to control circuit, the connection of the metal foils in the flexible thin film sensor 1 are as follows, the metal foils of the upper layer metal sheet 10 are wired in a transverse direction before connecting to connection terminal 13 (traverse connection terminals), and the metal foils of the lower layer metal sheet 15 are wired in a longitudinal direction before connecting to connection terminal 13 (longitudinal connection terminals), so that only one connection terminal 13 is needed to connect to each row or column of battery cells, and each group of metal foils corresponds to two battery cells. Thus, for n lithium ion battery cells, the required number of connection terminals X is $X=\sqrt{n}+1$; for automotive lithium-ion battery packs, the number of lithium ion battery cells usually is 5000 to 8000, and the maximum number of connection terminals required is $X=\sqrt{n}+1=\sqrt{8000}+1=90$.

Embodiment 3

Figure 5:
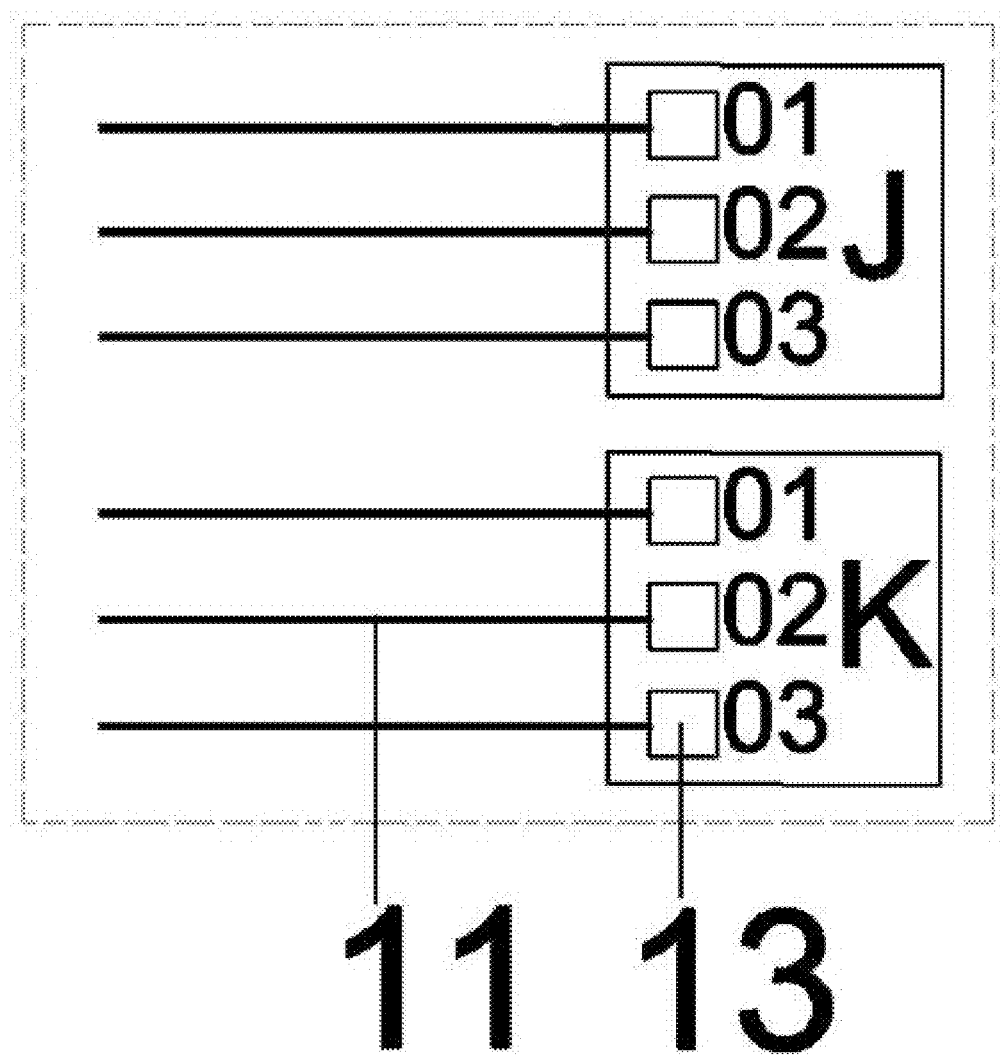
FIG. 5 is schematic diagram showing terminal connections of a flexible thin film sensor, according to one embodiment.
Figure 8:
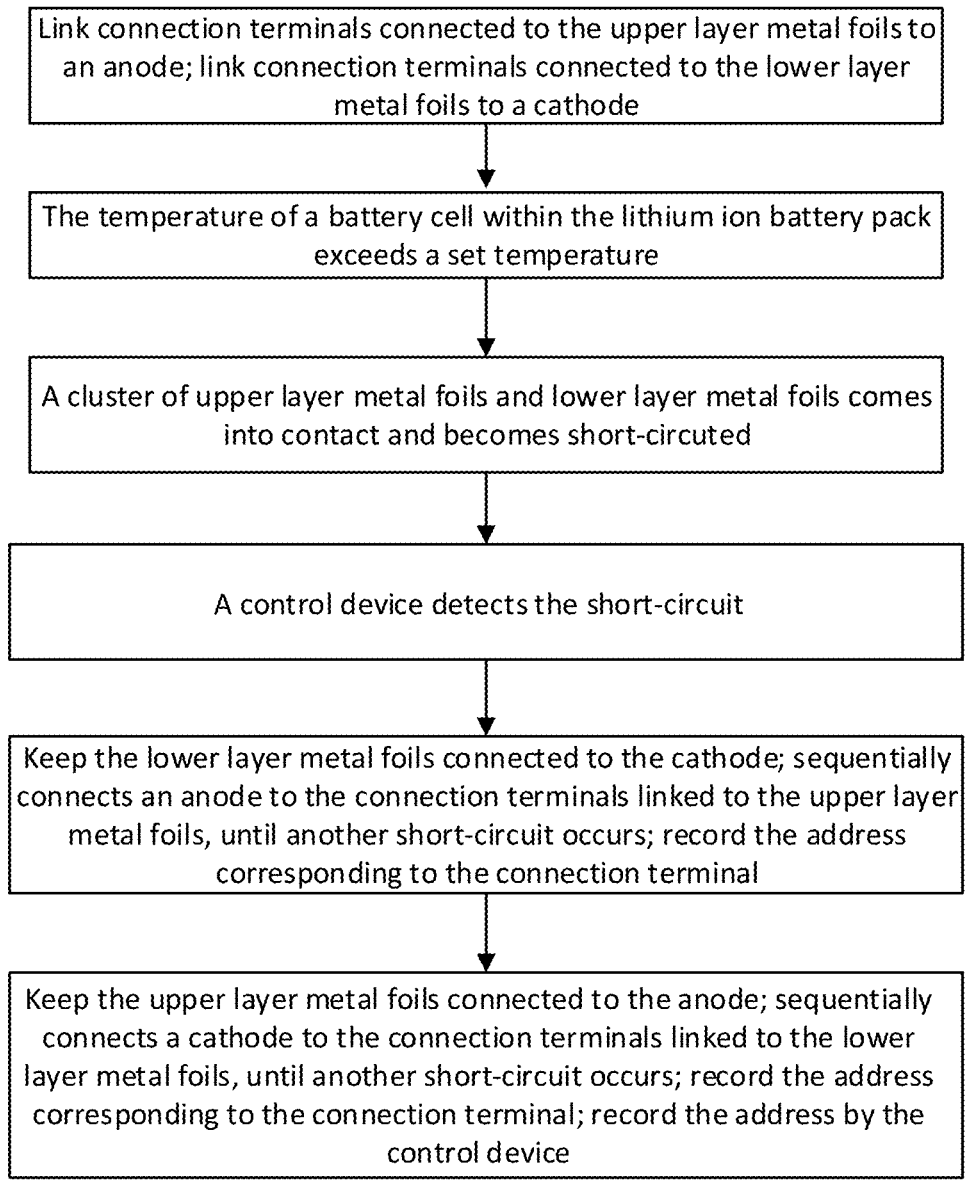
FIG. 8 is flow diagram showing a workflow of a flexible thin film sensor, according to one embodiment.

Positioning of the overheated lithium ion battery cell is determined or calculated by combining short-circuiting test results from the traverse connection terminals and the longitudinal connection terminals. The implementation logic is shown in FIG. 8. For a N row×M column grid of connection terminals, there are N×M combinations of longitudinal connection terminals and traverse connection terminals, and each lithium ion battery cell corresponds to one of the combinations. In the alarm controller, the connection terminals connected to the upper layer metal foils and the lower layer metal foils are numbered separately, with the traverse connection terminals linked to the upper layer metal foils being numbered 1 to M, and the longitudinal connection terminals linked to the lower layer metal foils being numbered 1 to N. During use, connect the connection terminals of all the upper layer metal foils to an anode, and the connection terminals of all the lower layer metal foils to a cathode. The voltage is provided by the single chip microcomputer. When the battery cell temperature is normal, the intermediate layer does not melt or rupture, the voltage provided by the single chip microcomputer does not produce an electric current. When the temperature of any battery cell is higher than the set melting point of plastics in the intermediate layer, the plastics in the intermediate layer melts and ruptures. The upper layer metal foils and lower layer metal foils at the corresponding locations come into direct contact and produce a short-circuit. The electric current caused by this short-circuit is detected by the single chip microcomputer, which in turn sends an alarm signal to the alarm controller. The alarm controller prompts the LED alarm light to flash and the buzzer to buzz. Keep the lower layer metal foils connected to the cathode; sequentially connects an anode to the connection terminals linked to the upper layer metal foils, until another short-circuit occurs; record the address corresponding to the connection terminal. Keep the upper layer metal foils connected to the anode; sequentially connects a cathode to the connection terminals linked to the lower layer metal foils, until another short-circuit occurs; record the address corresponding to the connection terminal; record the address by the single chip microprocessor. The single chip microcomputer transmits the address, i.e., the numbers of the upper layer and lower layer metal foils corresponding to the short-circuiting, to the computer. The computer calculates the position of the overheated battery cell by comparing the address information with stored battery pack data, and display the position of the overheated battery on the display. As shown in FIG. 5, the K and J areas in the figure correspond to the corresponding areas in FIGS. 3 and 6. For ease of illustration, three rows and three columns are used here as an example. Area J is the lead-out connection terminal of the lower layer metal foil, Area K is the lead-out connection terminal of the upper metal foil, each terminal has its corresponding numbers: the 01, 02, 03 in the J area indicate the first, the second, and the third columns, 01, 02, and 03 in the K area represent the first, the second, and the third row. The row and column information corresponding to the address is stored in the computer. The use of three rows and three columns is for easy demonstration. In implementations row and column numbers can be adjusted according to the number of battery cells as well as the number of rows and columns of the battery cell array. For illustration purpose, assuming that the temperature of the battery cell in the first row and the third column rises above the pre-set detection temperature of the flexible thin film sensor 1, causing the upper layer metal foils and lower layer metal foils in the corresponding area of the battery cell to short-circuit, the final address obtained by the single chip microprocessor would be 0103, according to the detection principle. After transmitting the address data to the computer, the computer obtains the specific position of first row and the third column through the comparing with stored database, and displays the position on the display.

Embodiment 4

Figure 6:
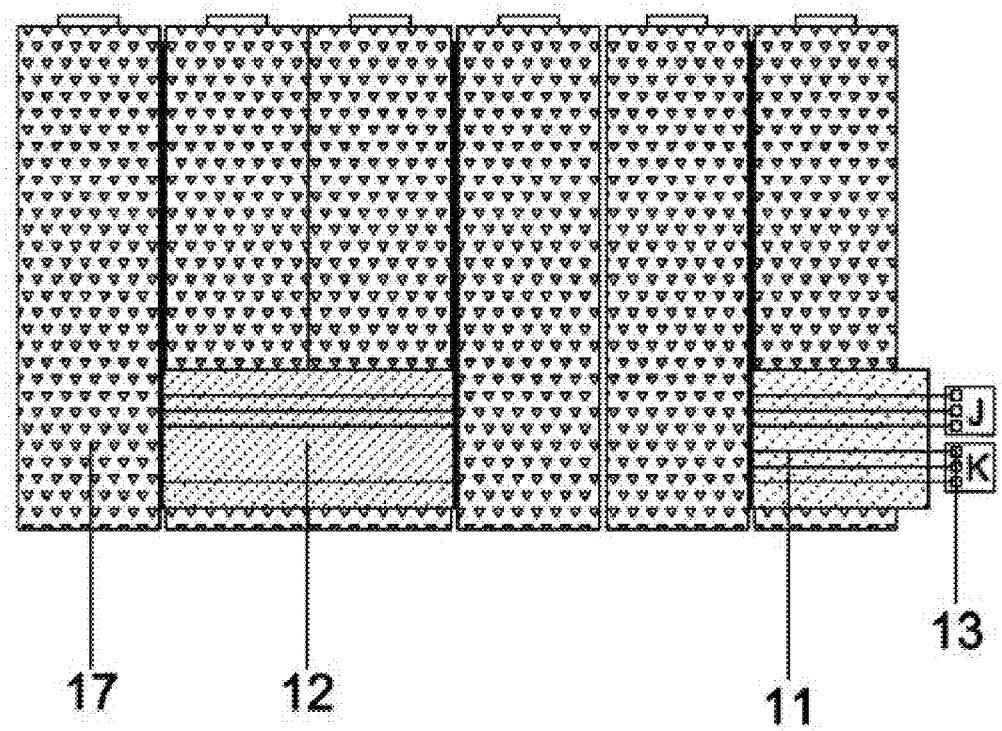
FIG. 6 is a schematic view of the working state of the flexible thin film sensor, according to one embodiment.

As shown in FIG. 5, box J and box K correspond to the corresponding boxes in FIGS. 3 and 6, FIG. 5 is a partially enlarged view of FIGS. 3 and 6, and J is the connection terminal corresponding to the internal wiring of the lower layer metal foil, with addresses 01, 02, 03 and so on; K is connection terminal corresponding to the internal wiring of the upper layer metal foil, with address of 01, 02, 03 and so on. The connection terminals in the J area and the K area are connected to the single chip microprocessor, and the single chip microprocessor searches for the address code of the metal foils corresponding to the overheated battery cell according to the detection method in Embodiment 3. Each address code corresponds to two battery cells in contact with a pair of the metal foils represented by the address code, so the basic unit is composed of two battery cells in the battery pack, and each basic unit corresponds to an address code. The positioning accuracy is two battery cells, that is, the specific location or position of overheating or thermal runaway can be reduced to between two specific battery cells.

Embodiment 5

Figure 7:
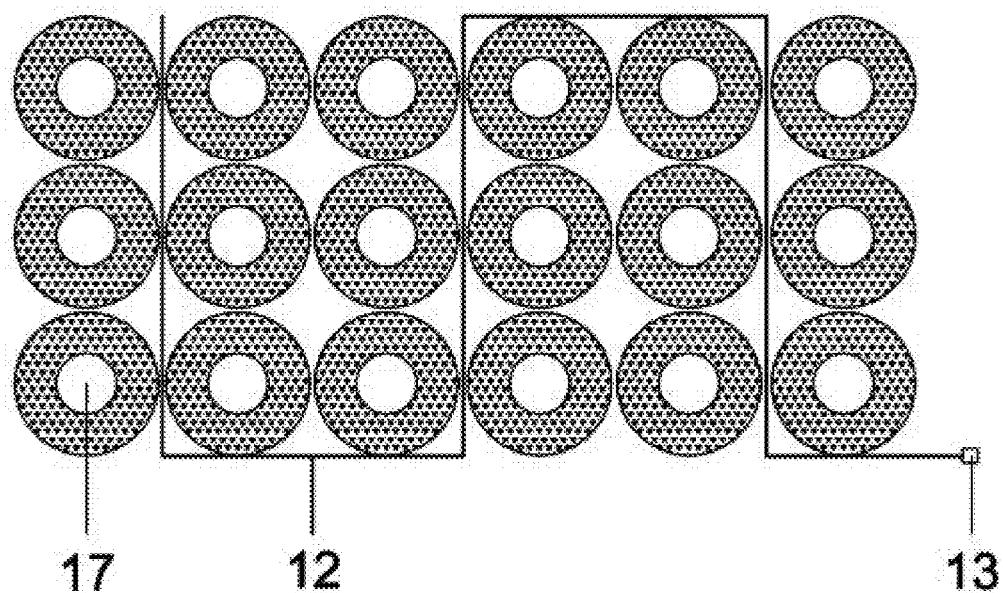
FIG. 7 is a top prospective view of FIG. 6.

FIGS. 6 and 7 are schematic views of the working state of the flexible thin film sensor, in one embodiment. FIG. 6 is a front view of the flexible thin film sensor during operation, FIG. 7 is a top view of FIG. 6, and FIG. 3 is a cross-sectional view of the flexible thin film sensor. When in use, after the flexible thin film sensor is folded ninety degrees according to the four axes and rotation directions shown in A, B, C, and D in FIG. 3, a gap the size of two battery diameters appears between A and B and between C and D. Place a row of three battery cells in the area to the left side of the A axis, place six battery cells arrayed in two rows and three columns in the area formed between the A and B axes, place 6 battery cells in the area formed between the C and D axes, and place a row of three battery cells in the area to the right side of the D axis. As shown in FIGS. 6 and 7, eventually, a total of six rows and three columns of battery cells are covered, each battery cell having a flexible thin film sensor contact area of equal size and identical shape. It is worth noting that this is just an example using six rows and three columns of batteries. If the number of battery cell rows and columns in the battery pack does not match this example, a match can be found by increasing the number of rows and columns of the metal foils.

The beneficial effect of the present invention includes the following. The flexible thin film sensor used in the present invention is a new type of sensor, with the advantages of small size, light weight, easy driving, and convenient layout. The flexible thin film sensor is in close contact with the surface of the battery to ensure the same temperature distribution between the flexible thin film sensor and the battery. When the battery temperature increases, the flexible thin film sensor can quickly heat up to a level comparable to the battery temperature. As long as there is a spot where the temperature exceeds the flexible thin film sensor's pre-set detection temperature, the flexible thin film sensor is able detect the hot spot to ensure the timely and comprehensive detection of overheating. The detection principle of the flexible thin film sensor is that the middle layer of the detector is a plastic film that will melt when the temperature rises to a certain degree. When the temperature of the flexible thin film sensor reaches the middle layer melting temperature, the middle layer of plastic film at the corresponding position will melt, so that a pair of metal foils above and below the corresponding position of the plastic film will connect and form a short-circuit. Whether there is an overheating spot inside the battery pack can be determined by applying voltage to test the existence of a short-circuit between the upper layer and lower layer metal foils. The location of the overheating spot can be determined by determining the position of the short-circuited pair of metal foils. The detection principle is straightforward, the detection signal is clear, because a short-circuit signal is a clear signal. Multiple pairs of metal foils can be installed inside a flexible thin-film sensor. When properly arranged, 72 to 90 wiring connection terminals are able to detect the overheating of 6000 to 8000 single cells in the entire battery pack. The detection accuracy is two cells, that is, the overheating position can be narrowed to among two single cells. The number of wiring required for detection is small, the detection range is large, the positioning accuracy is high, the thickness of the flexible thin film sensor is low, the shape of the flexible thin film sensor can be designed according to the arrangement of the battery cells in the battery pack, and it is flexible and can be wound, which effectively overcomes the shortcomings of traditional temperature sensors such as low coverage, difficult layout design, and crowding the internal space of the battery pack, making lithium ion battery overheat detection more accurate and reliable. The detection sequence is to first determine that the internal battery cell of the battery pack is overheated, and then to determine the specific location of the hot spot. Therefore, an alarm can be issued to remind personnel to prepare, and then provide a specific hot spot location for further processing. The design of the early warning logic conforms to the on-site disposal logic.

What is claimed is:

1. A system for early-warning and positioning of interior overheating in a lithium ion battery pack, comprising:
   a sensor unit comprising a flexible thin film sensor;
   a controller unit, further comprising:
      a single chip microprocessor;
      an alarm controller;
      a computer; and
      a display;
      wherein the single chip microprocessor and the alarm controller are connected to the computer, and the computer is connected to the display;
      wherein the single chip microprocessor is connected to the flexible thin film sensor;
   an alarm unit, further comprising:
      a LED alarm light; and
      a buzzer; and
   an auxiliary unit, further comprising:
      a power supply; and
      a constant value resistor;
      wherein the power supply provides power separately to the controller unit and the alarm unit, and wherein the constant value resistor is directly connected to the power supply and configured to prevent the power supply from being damaged by short-circuit.

2. The system according to claim 1, wherein the flexible thin film sensor further comprising: an upper substrate layer, an upper layer metal sheet, an intermediate layer, a lower layer metal sheet, and a lower substrate layer arranged from top to bottom; wherein the layers are pressed into the flexible thin film sensor; wherein the lower layer metal sheet and the upper layer metal sheet are respectively connected to a positive and a negative electrode via wires, and configured to test whether the two metal sheets are short-circuited.

3. The system according to claim 2, wherein the upper substrate and the lower substrate comprise polyimide film, wherein an upper surface of the upper substrate layer or a lower surface of the lower substrate comprises an adhesive layer are configured to tightly bind to the battery to enhance thermal conductivity.

4. The system according to claim 2, wherein the upper layer metal sheet and the lower layer metal sheet comprises metal foils.

5. The system according to claim 2, wherein the wires comprise flexible printed circuit or metal wires.

6. The system according to claim 2, wherein the intermediate layer comprises a plastic film with a melting point adjusted to measurements, further comprising:
   a plastic film with a melting point of 70° C. when monitoring a start of battery overheating;
   a plastic film with a melting point of 120° C. when monitoring battery thermal runaway;
   a plastic film with a melting point of between 70° C. to 120° C. when monitoring a state between battery overheating and battery thermal runaway.

7. A method for providing early-warning and positioning of interior overheating in a lithium ion battery pack, comprising the steps of:
   providing a sensor unit comprising a flexible thin film sensor that further comprises an upper substrate layer, an upper layer metal sheet, an intermediate layer, a lower layer metal sheet, and a lower substrate layer arranged from top to bottom; wherein the layers are pressed into the flexible thin film sensor; wherein the upper layer metal sheet and the lower layer metal sheet are respectively connected to a positive and a negative electrode via wires, and configured to test whether the two metal sheets are short-circuited providing a controller unit comprising a single chip microprocessor, an alarm controller, a computer and a display, wherein the single chip microprocessor and the alarm controller are connected to the computer, and the computer is connected to the display, wherein the single chip microprocessor is connected to the flexible thin film sensor;

providing an alarm unit comprising a LED alarm light and a buzzer; and providing an auxiliary unit comprising a power supply and a constant value resistor, wherein the power supply provides power separately to the controller unit and the alarm unit, and wherein the constant value resistor is directly connected to the power supply and configured to prevent the power supply from being damaged by short-circuit;

when temperature of a lithium ion battery exceeds a set temperature, detecting the melting of a portion of the intermediate layer of the flexible thin film sensor in contact with the lithium ion battery, by detecting a short-circuit of a pair of the upper layer metal sheet and the lower layer metal sheet corresponding to the short-circuit location, and transmitting a short-circuit signal to the single chip microprocessor;

upon receiving the short-circuit signal, sending an alarm signal by the single chip microprocessor to the alarm controller; the alarm controller prompts the LED alarm light to flash and prompts the buzzer to send out an alarm sound;

upon receiving the short-circuit signal, determining, by the single chip microprocessor, an address of the pair of upper layer metal sheet and lower layer metal sheet corresponding to the short-circuit location, and sending the address to the computer; and upon receiving the address, determining, by the computer, the position of the lithium ion battery cell; and showing the position on the display.

\* \* \* \* \*